US011609188B2

(12) United States Patent
Nakada et al.

(10) Patent No.: US 11,609,188 B2
(45) Date of Patent: Mar. 21, 2023

(54) PROCESSING CONDITION DETERMINATION SYSTEM AND PROCESSING CONDITION SEARCHING METHOD

(71) Applicant: Hitachi, Ltd., Tokyo (JP)

(72) Inventors: Hyakka Nakada, Tokyo (JP); Takeshi Ohmori, Tokyo (JP)

(73) Assignee: HITACHI, LTD., Tokyo (JP)

( * ) Notice: Subject to any disclaimer, the term of this patent is extended or adjusted under 35 U.S.C. 154(b) by 184 days.

(21) Appl. No.: 17/209,735

(22) Filed: Mar. 23, 2021

(65) Prior Publication Data

US 2021/0372943 A1 Dec. 2, 2021

(30) Foreign Application Priority Data

May 27, 2020 (JP) .............................. JP2020-092150

(51) Int. Cl.
*G01N 21/95* (2006.01)
*G06N 20/00* (2019.01)
(Continued)

(52) U.S. Cl.
CPC ......... *G01N 21/9501* (2013.01); *G06N 20/00* (2019.01); *G01N 2021/8411* (2013.01); *G01N 2021/8877* (2013.01)

(58) Field of Classification Search
CPC ....... G01N 21/9501; G01N 2021/8411; G01N 2021/8877; G06N 20/00; G05B 2219/2602
See application file for complete search history.

(56) References Cited

U.S. PATENT DOCUMENTS 7,058,467 B2 * 6/2006 Tanaka ............... G05B 23/0221
700/110
7,877,161 B2 * 1/2011 Tomoyasu .......... H01L 21/0337
430/311
(Continued)

FOREIGN PATENT DOCUMENTS

JP 2016533925 A 11/2016
JP 2018117116 A 7/2018
(Continued)

OTHER PUBLICATIONS

Office Action dated Apr. 15, 2022 in Korean Application No. 10-2021-0033800.

*Primary Examiner* — Hung V Nguyen
(74) *Attorney, Agent, or Firm* — Miles & Stockbridge, P.C.

(57) ABSTRACT

To efficiently search a processing condition of giving a desired target processing result, there is provided a processing condition determination system including a processing apparatus that processes a sample, a processing monitor system that monitors the state of the processing in the processing apparatus, and an analysis system that sets the processing condition of the processing apparatus of giving a target processing result, wherein the system includes a processing condition and result database that stores a set of an explanatory variable that is a processing condition under which the processing apparatus processes a sample and an objective variable that is the processing result obtained by the processing apparatus' processing the sample, and when the processing apparatus processes the sample under the processing condition set using the correlation model derived from the database and it is determined that a probability of failure occurrence becomes high, based on the monitor data of the processing monitor system, the processing apparatus
(Continued)

stops the processing under the present processing condition and the analysis system resets a new processing condition.

14 Claims, 10 Drawing Sheets

(51) Int. Cl.
    *G01N 21/88*     (2006.01)
    *G01N 21/84*     (2006.01)

(56)     References Cited

U.S. PATENT DOCUMENTS

| | | |
|---|---|---|
| 10,788,817 B2 * | 9/2020 | Kawai .............. G05B 19/41885 |
| 2015/0045928 A1 | 2/2015 | Perez et al. |
| 2018/0358271 A1 | 12/2018 | David |
| 2019/0244870 A1 | 8/2019 | Feng et al. |

FOREIGN PATENT DOCUMENTS

| | | |
|---|---|---|
| KR | 1020160076646 A | 7/2016 |
| KR | 1020170086585 A | 7/2017 |

\* cited by examiner

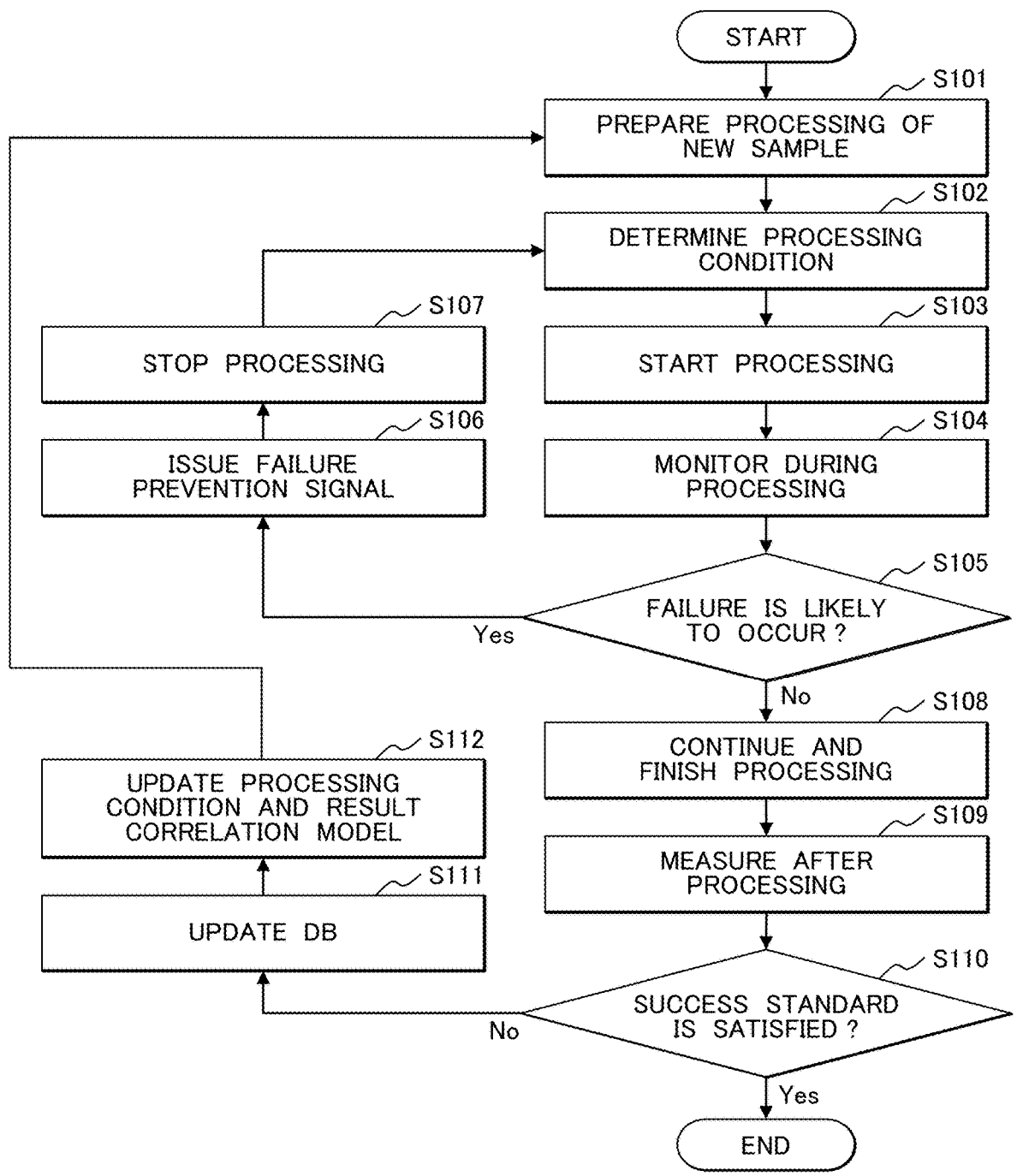

FIG. 4

| DATA NUMBER | EXPLANATORY VARIABLE | | | OBJECTIVE VARIABLE | | |
|---|---|---|---|---|---|---|
| | PRESSURE (Pa) | POWER (W) | ... | DEPTH (nm) | Top CD (nm) | ... |
| 1 | $P_1$ | $W_1$ | ... | 70 | 43 | ... |
| 2 | $P_2$ | $W_2$ | ... | × | × | ... |
| ⋮ | ⋮ | ⋮ | ⋮ | ⋮ | ⋮ | ⋮ |
| N | $P_N$ | $W_N$ | ... | 109 | 52 | ... |

FIG. 6

| DATA NUMBER | EXPLANATORY VARIABLE | | | OBJECTIVE VARIABLE | | |
|---|---|---|---|---|---|---|
| | LASER OUTPUT (W) | SCANNING SPEED (W) | ... | HEIGHT (mm) | AVERAGE WIDTH (mm) | ... |
| 1 | $P_1$ | $S_1$ | ... | 360 | 109 | ... |
| 2 | $P_2$ | $S_2$ | ... | × | × | ... |
| ⋮ | ⋮ | ⋮ | ⋮ | ⋮ | ⋮ | ⋮ |
| N | $P_N$ | $S_N$ | ... | 354 | 113 | ... |

PROCESSING CONDITION DETERMINATION SYSTEM AND PROCESSING CONDITION SEARCHING METHOD

CROSS-REFERENCE TO RELATED APPLICATION

This application claims priority to Japanese Patent Application No. 2020-092150 filed on May 27, 2020, the entire contents of which are incorporated by reference herein.

BACKGROUND OF THE INVENTION

The invention relates to a processing condition determination system of determining a processing condition for processing a target sample by a processing apparatus in a process development and a method of searching the above processing condition.

In the semiconductor process, a semiconductor processing apparatus is operated under a proper processing condition, hence to perform desirable semiconductor processing. The proper processing condition is unknown at first, but is obtained by the process development. In recent years, together with the introduction of new material forming a device, the structure of the device becomes complicated, the control range of the processing apparatus is expanded, and many control parameters are added there. A process is formed into multi-steps, and fine and complicated processing is realized. The process development for the manufacturing apparatus as above is performed, hence to produce a high-quality device.

In order to fully derive the performance of such an apparatus, optimization of many control parameters is essential; and know-how of the process development, a high skill of the equipment operation, and many trials and errors of the processing tests are necessary. However, the time period for the optimization of a processing condition is apt to prolong because of a shortage of the engineers having the necessary know-how and skill and an increase in the number of the measurements of the processing results of many processing tests. This prolongation of the process development period becomes a problem not only in the semiconductor process but also in many types of manufacturing processes including the metal additive manufacturing process.

In order to solve a delay in the process development, processing condition search through machine learning is considered effective. To adopt the machine learning, a database of processing condition and result data consisting of the processing condition and the processing result (hereinafter, referred to as a processing condition and result DB) is necessary.

A lot of the manufacturing processes require examinations and extractions of the processing results through the measurements after the processing, and a lot of experiments and measurements are necessary for construction of the processing condition and result DB. For example, in the semiconductor process, after the processing, a cross-section observation SEM (Scanning Electron Microscope) is used for the measurement, in order to obtain the processing result of a device sample having a nanoscale fine structure. Further, in the metal additive manufacturing process, a breaking test is performed after the processing to measure the internal defect rate or the hardness of a mold sample. The experiment including the above measurement is the process requiring the longest time in the processing condition research through the machine learning.

Because, in the recent semiconductor process, microfabrication of the structure is advanced, a structural break such as a pattern break as described later in FIG. 3, happens in a wide processing condition area, depending on a given processing condition. In this case, the processing result such as the structure size after the processing cannot be obtained and a new processing condition has to be set, which increases the number of the experiments for construction of the processing condition and result DB, causing a delay of the processing condition search through the machine learning. This holds true to many manufacturing processes including the metal additive manufacturing process having a delicate processing step, as well as the semiconductor process.

Therefore, in order to speed up the processing condition search through the machine learning, it is necessary to avoid occurrence of failure processing result and efficiently build the processing condition and result DB. The manufacturing process for avoiding the failure occurrence includes the following related arts.

In Japanese Unexamined Patent Application Publication (Transfer of PCT Application) No. 2016-533925, an in-process monitor is used to monitor the processing state in the additive manufacturing process, and when confirming the failure occurrence, the processing is stopped. Thus, based on the accumulated processing results, a processing condition free from the failure occurrence is predicted.

In Japanese Unexamined Patent Application Publication No. 2018-117116, an in-process monitor is used to monitor the processing state in the semiconductor process and when confirming the achievement of the processing result in the vicinity of a target processing result, the processing is stopped.

SUMMARY OF THE INVENTION

The invention aims to shorten the process development period in the manufacturing process. In other words, it aims to derive an unknown processing condition of giving a desired target processing result, at high speed. As a processing condition of a processing apparatus generally has a lot of parameters, the processing condition is effectively optimized by the machine learning; however, a lot of failures occur during the process development, and it takes a long time to build the processing condition and result DB disadvantageously. Therefore, it is necessary to avoid as much of the generation of the failure processing result as possible and to efficiently build the processing condition and result DB.

Japanese Unexamined Patent Application Publication (Transfer of PCT Application) No. 2016-533925 is to stop the processing after the failure occurrence, and it is sometimes hard to convert the processing results into data. Further, to predict the processing condition free from the failure occurrence, a lot of failure occurrence data is required. In deriving the processing condition of giving the target processing result, like the invention, the data of the failure processing results is less important than the data of the good processing results. Taking time to obtain the failure occurrence data of less importance causes a delay in the process development period.

Japanese Unexamined Patent Application Publication No. 2018-117116 is to stop the processing at the time of confirming the achievement of the processing result in the vicinity of the target processing result. Accordingly, it is expected that the probability of obtaining the failure processing result can be reduced. Unlike Japanese Unexamined Patent Application Publication No. 2018-117116 aiming at the mass production stability, however, the processing condition of giving the target processing result is unknown in the process development, and in order to build the processing condition and result DB, it is necessary to set various processing conditions and actually process a sample under set various processing conditions. Therefore, in a lot of processing, it is difficult to achieve the processing result in the vicinity of the target processing result, and it is considered that the processing stop according to Japanese Unexamined Patent Application Publication No. 2018-117116 is not worked in many cases.

A processing condition determination system according to one embodiment of the invention includes a processing apparatus that processes a sample, a processing monitor system that monitors the state of the processing in the processing apparatus, and an analysis system that sets a processing condition of the processing apparatus of giving a target processing result, wherein the analysis system includes: a processing condition and result database that stores data as a set of an explanatory variable and an objective variable, with one and more parameters of the processing condition under which the processing apparatus processes the sample as the explanatory variable and one and more parameters of the processing result obtained by the processing apparatus' processing the sample under the processing condition as the objective variable; a processing condition and result correlation model analysis unit that estimates a correlation model of the explanatory variable and the objective variable, using the data stored in the processing condition and result database; a processing condition analysis unit that sets a processing condition of giving the target processing result, using the correlation model estimated by the processing condition and result correlation model analysis unit; and a failure predicting unit that outputs a failure prevention signal when a probability of failure occurrence as for one and more of the objective variable becomes high after the processing by the processing apparatus, based on the monitor data of the processing monitor system, and the processing apparatus processes the sample under the processing condition set by the processing condition analysis unit and stops the processing under the present processing condition, upon receipt of the failure prevention signal from the failure predicting unit, and the processing condition analysis unit resets a new processing condition of giving the target processing result.

It is possible to previously avoid the failure occurrence in the processing, under the processing condition with a high probability of failure occurrence, which is estimated through machine learning, and to efficiently build the processing condition and result DB. According to this, it is possible to efficiently search a processing condition of giving a desired target processing result.

Other problems and novel features will be apparent from the description of this specification and the attached drawings.

BRIEF DESCRIPTION OF THE DRAWINGS

FIG. 2 is a flow chart showing the search procedure of a processing condition of giving a target processing result;

FIG. 4 is an example of the processing condition and result DB;

FIG. 6 is an example of the processing condition and result DB;

DETAILED DESCRIPTION OF THE PREFERRED EMBODIMENTS

Figure 1:
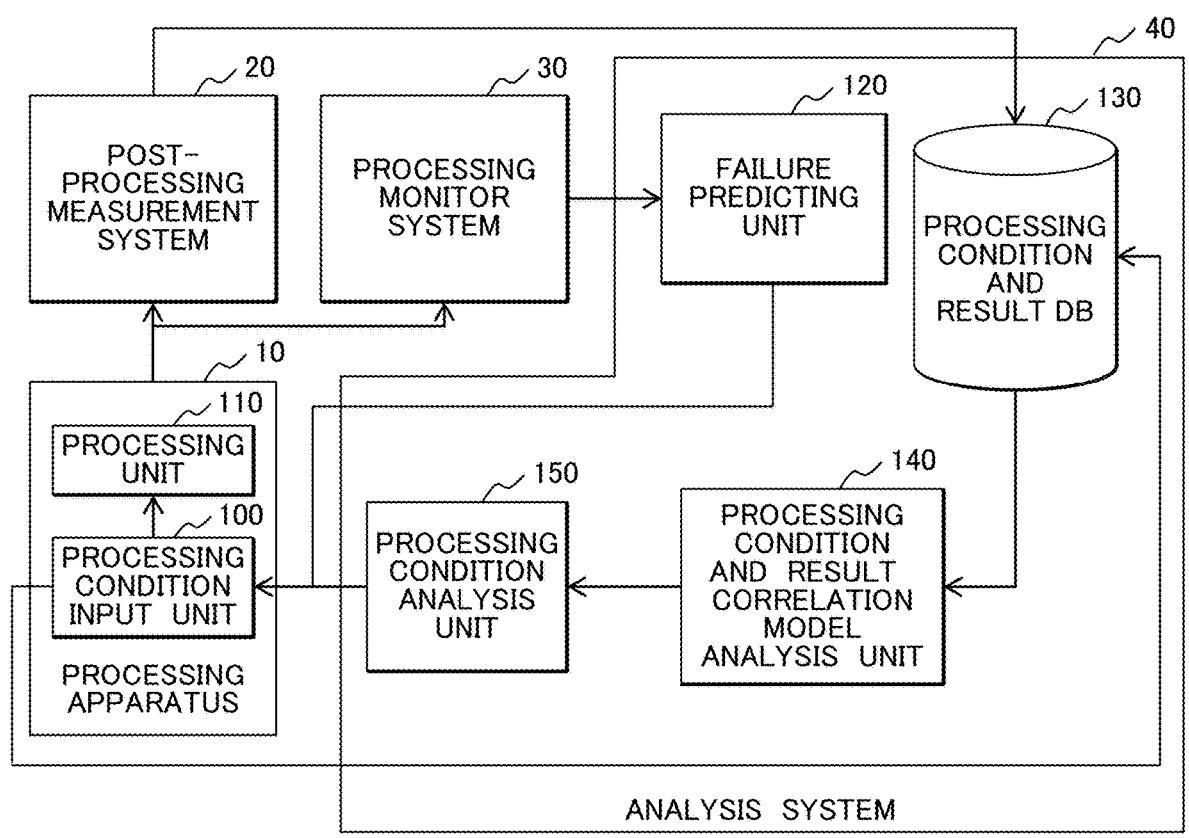
FIG. 1 is a constitutional example of a processing condition determination system.

Hereinafter, preferred embodiments of the invention will be described using the drawings. The invention cannot be restricted to the contents as described in the following embodiments. Those skilled in the art could easily understand that its concrete constitution can be modified without departing from the spirit or effect of the invention. Further, for easy understanding of the invention, the position, size, shape, and range of each component shown in the drawings are not shown in the actual position, size, shape, and range in some cases. The invention is not restricted to the position, size, shape, and range described in the drawings.

FIG. 1 shows a constitutional example of a processing condition determination system according to one embodiment of the invention. A processing apparatus 10 is an apparatus for processing a sample as a processing target and connected to a postprocessing measurement system 20. A processing monitor system 30 is built in the processing apparatus 10. The processing apparatus 10 includes a processing condition input unit 100 that receives a processing condition. The processing condition input unit 100 receives the input of a processing condition determined by an analysis system 40 described later. The processing apparatus 10 includes a processing unit 110, where a sample as a processing target is processed under the processing condition input in the processing condition input unit 100.

The processing apparatus 10 includes a lithography device, a film forming device, a pattern processing device, an ion implanter, a heating device, and a cleaning device as a semiconductor manufacturing apparatus. The lithography device includes an exposing device, an electron beam drawing device, an X-ray drawing device, and the like. The film forming device includes a CVD device, a PVD device, a deposition device, a sputtering device, a thermal oxidation device, and the like. The pattern processing device includes a wet etching device, a dry etching device, an electron beam processing device, a laser processing device, and the like. The ion implanter includes a plasma doping device, an ion beam doping device, and the like. The heating device includes a resistance heating device, a lamp heating device, a laser heating device, and the like. The cleaning device includes a liquid cleaning device, an ultrasonic cleaning device, and the like. Further, the processing apparatus 10 is not restricted to the semiconductor manufacturing apparatus, but it may be the additive manufacturing apparatus. The additive manufacturing apparatus includes various methods of vat photopolymerzation, material extrusion, power bed fusion, binder jetting, sheet lamination, material jetting, and directed energy deposition.

The postprocessing measurement system 20 measures the sample processed by the processing apparatus 10 to obtain the processing result. As an example of the processing result, there are a size of the sample, a size of the internal structure of the sample, electric characteristics of the sample, mechanical characteristics of the sample, and a defect generated in the sample.

The postprocessing measurement system 20 includes a measurement device which measures the reflection, permeation, interference, absorption, or polarization spectrum generated when entering an electron, a beam, laser, X-ray, and the like in a sample and obtains the information of the target sample. Specifically, it includes a measurement device using an electron microscope, a measurement device using an optical microscope, a temperature measurement device using infrared light, a defect detecting device using the Kelvin probe Force Microscopy, and a prober device of estimating the electric characteristics of the processed sample.

The processing monitor system 30 is an in-process monitor system built in the processing apparatus 10 to monitor the processing state during the processing. The monitor result is entered to a failure predicting unit 120.

The processing monitor system 30 includes a monitor for the medium used for the processing of plasma, gas, and liquid acting on a sample, or a product generated by the processing, during the period in which the processing apparatus 10 processes the sample. Further, the above system includes a plasma emission monitor using optical spectrum measurement, a deposit monitor within the processing chamber using infrared spectroscopic measurement, an atom or molecule monitor discharged from the target using a mass spectrometer, and an electric characteristic monitor within the processing chamber using an in-depth probe. Further, the processing monitor system 30 includes a measurement device which measures the reflection, permeation, interference, absorption, or polarization spectrum generated when entering an electron, a beam, laser, X-ray in a sample and obtains the information of the sample as the processing target. Specifically, it includes a measurement device using an electron microscope, a measurement device using an optical microscope, a temperature measurement device using infrared light, a defect detecting device using the Kelvin probe Force Microscopy, and a prober device of estimating the electric characteristics of the processed sample.

The analysis system 40 includes the failure predicting unit 120, a processing condition and result DB 130, a processing condition and result correlation model analysis unit 140, and a processing condition analysis unit 150. The analysis system 40 is a system for automatically setting the processing condition, and the set processing condition is input to the processing condition input unit 100.

The failure predicting unit 120 predicts whether or not a failure occurs in the sample after the processing, based on the monitor data during the processing output from the processing monitor system 30. When the failure predicting unit 120 predicts the failure occurrence, it issues a failure prevention signal and inputs the processing condition corresponding to the processing stop to the processing condition input unit 100, to stop the processing. Unless the failure prevention signal is issued, the processing under the current processing condition is continued. Here, the failure means that after the processing, measurement becomes impossible as for one and more parameters of the objective variable described later.

In the processing condition and result DB 130, a data set of an explanatory variable and an objective variable defined as follows is stored. Of the processing conditions in the whole processing performed on one sample, one and more parameters are defined as the explanatory variable and of the processing results about the sample, one and more parameters are defined as the objective variable. The explanatory variable data is output from the processing condition input unit 100 and the objective variable data is output from the postprocessing measurement system 20.

The processing condition and result correlation model analysis unit 140 estimates a regression model about the explanatory variable and the objective variable, using the processing condition and result DB 130. Here is used a model using the machine learning of linear regression, neutral network, Kernel method, decision tree, and regression tree is used.

The processing condition analysis unit 150 predicts the processing condition of giving a target processing result, using the model estimated by the processing condition and result correlation model analysis unit 140 and inputs the above to the processing condition input unit 100.

Here, the analysis system 40 shows the whole of all the functions in the processing condition determination system, and all the blocks included in the analysis system 40 are not to be processed restrictively by one information processor. The whole of the analysis system 40 may be realized by a control computer of controlling the processing apparatus 10; alternatively, for example, the failure predicting unit 120, the processing condition and result correlation model analysis unit 140, and the processing condition analysis unit 150 may be realized by different information processors. A hardware scheme of installing each block of the analysis system 40 is not restricted particularly.

FIG. 2 shows a flow chart of searching for the processing condition of giving a desired target processing result for the processing apparatus 10, by the system shown in FIG. 1. Hereinafter, using FIG. 2, the state of the processing condition search will be described.

Figure 3A:
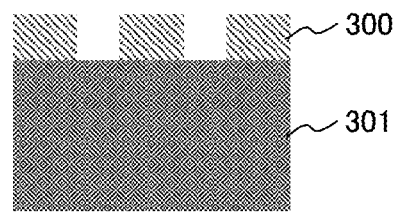
FIG. 3A is a mask-attached pattern sample before the processing.
Figure 3B:
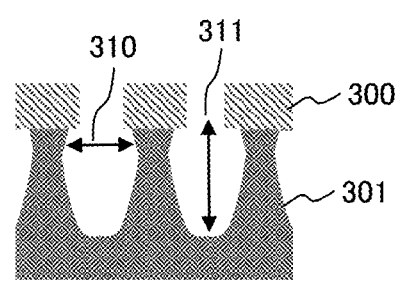
FIG. 3B is a mask-attached pattern sample during the processing.
Figure 3C:
FIG. 3C is a mask-attached pattern sample in which failure occurs.

Here, as a typical example of a sample to be processed by the processing apparatus 10, there is a mask-attached pattern sample as shown in FIGS. 3A to 3C. FIG. 3A shows a mask-attached pattern sample before the processing. A mask 300 with a pattern is formed on an etched film 301. When this sample is etched by the semiconductor manufacturing apparatus, the etched film 301 is preferentially etched as shown in FIG. 3B. In this case, as the processing result, for example, there are Top CD (Critical Dimension) 310 and depth 311. The Top CD 310 is the width of the etched portion in the vicinity of the boundary between the mask 300 and the etched film 301, and the depth 311 is the depth etched from the measurement position of the Top CD 310 as a reference.

On the contrary, FIG. 3C shows a mask-attached pattern sample failed by the excessive etching. When the processing condition given to the processing apparatus 10 is inappropriate, the boundary position between the mask 300 and the etched film 301 cannot be confirmed because of the pattern break in this example, and therefore, it is impossible to measure the Top CD 310 and the depth 311. As the result, in FIG. 4, there occur vacancies in the data (data No. 2) illustrated by a gray portion in a table, as shown by an example of the processing condition and result DB 130 in the etching processing performed on the mask-attached pattern sample.

Figure 5A:
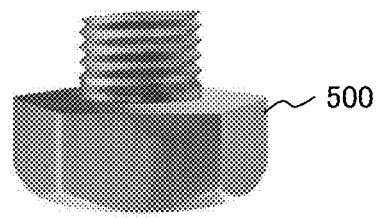
FIG. 5A is a screw-shaped molding samples during the processing.
Figure 5B:
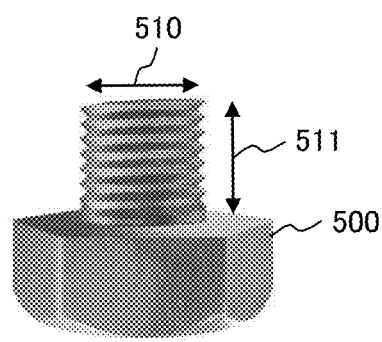
FIG. 5B is a view for use of the processing result of the screw-shaped molding sample.
Figure 5C:
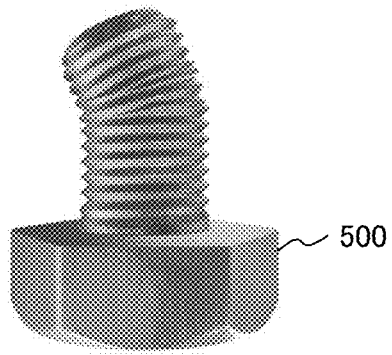
FIG. 5C is a screw-shaped molding sample in which failure occurs.

Further, as another typical example of a sample to be processed by the processing apparatus 10, there is a screw-shaped molding sample as shown in FIGS. 5A to 5C. FIG. 5A is a screw-shaped molding sample 500 during the processing, and one example of this sample resulting from the mold processing by an additive manufacturing apparatus is shown in FIG. 5B. Here, as the processing result, for example, an average width 510 and a height 511 are measured. On the contrary, FIG. 5C shows an example of the screw-shaped molding sample failed by the excessive heating. In this case, it becomes difficult to measure the average width 510 and the height 511 because of a distortion occurring in the molding object affected by the melting. FIG. 6 shows an example of the processing condition and result DB 130 when performing the mold processing on the screw-shaped molding sample. When a failure occurs in the processing result like this, data vacancies (data No. 2) happen as shown by the gray portion in the table.

Therefore, this embodiment controls the processing conditions given to the processing apparatus 10 to avoid these data vacancies and to build a normal database.

At first, a new sample before the processing is carried to the processing unit 110 and set in a status capable of being monitored by the processing monitor system 30 (S101). Then, the processing condition analysis unit 150 determines the processing condition (S102). In the determination method, for example, with an objective variable corresponding to the target processing result as a target value, by using the least square estimation about this target value, an explanatory variable to make minimum a difference from the target value can be calculated. The processing condition having the calculated explanatory variable is input to the processing condition input unit 100.

The processing condition recommended by the processing condition analysis unit 150 is input to the processing condition input unit 100, to start the processing (S103). Specifically, in the mask-attached pattern sample shown in FIG. 3A, the etching processing gets started by the semiconductor manufacturing apparatus and, in the screw-shaped molding sample shown in FIG. 5A, the mold processing gets started by the additive manufacturing apparatus.

Figure 7:
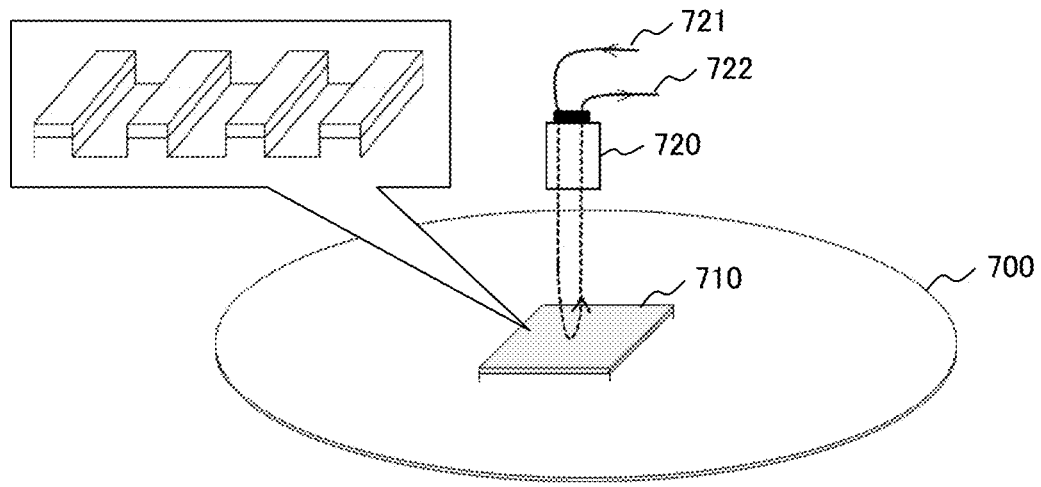
FIG. 7 is an example of an optical interference monitor.
Figure 8:
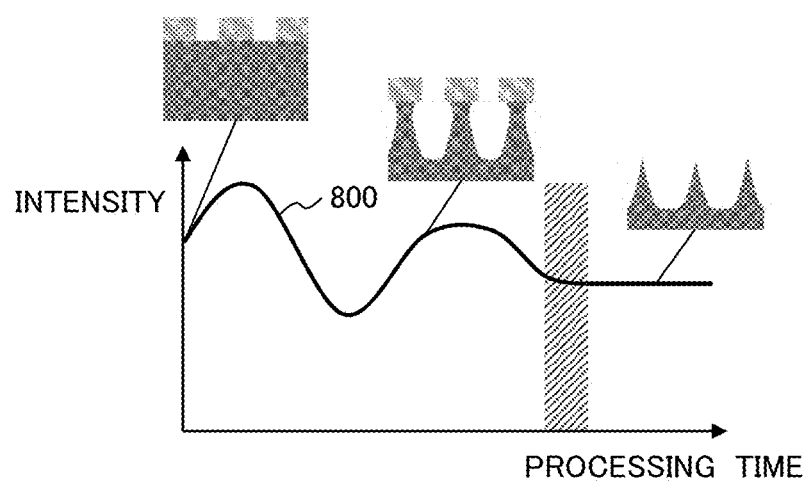
FIG. 8 is an example of the monitor data of interference light intensity by the optical interference monitor.
Figure 9:
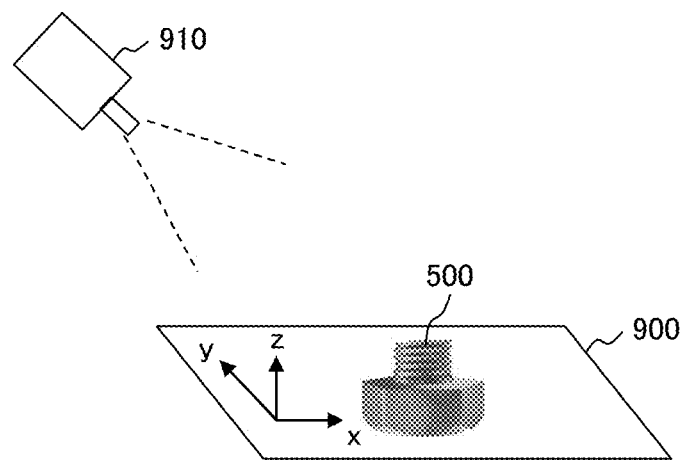
FIG. 9 is an example of a heat distribution monitor.
Figure 10:
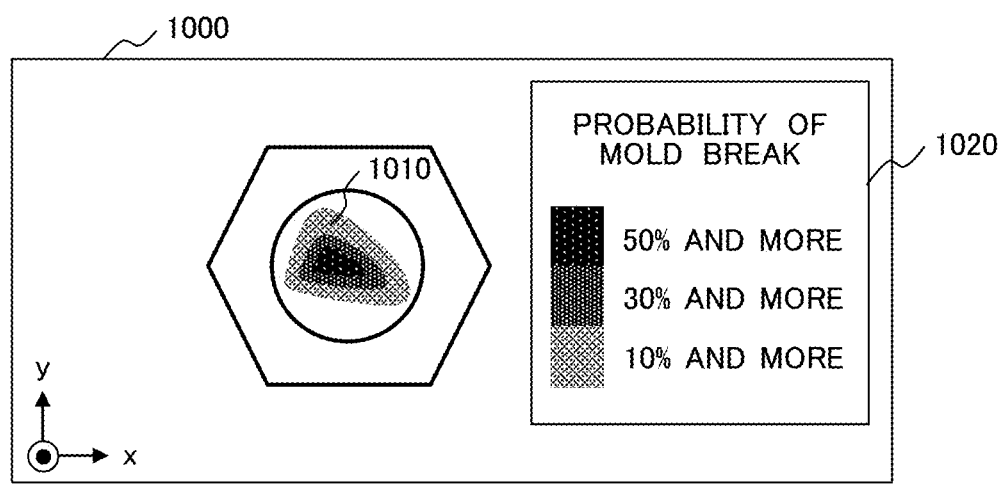
FIG. 10 is an example of the monitor data of heat distribution by the heat distribution monitor.

The processing monitor system 30 properly monitors the state during the processing in the processing apparatus 10 (S104). For example, in the case of the mask-attached pattern sample shown in FIG. 3A, an optical interference monitor can monitor the progress state of the etching processing by monitoring the interference light generated from the sample. This situation is shown in FIG. 7. A chip of the mask-attached pattern sample 710 is formed on a wafer 700 and an incident light 721 enters the sample through an optical element 720 right above. The reflected light is measured through the optical element 720 as a reflection light 722. The incident light 721 and the reflection light 722 generate an interference light. FIG. 8 shows a time-series graph 800 of the interference light intensity as the monitor result. On the other hand, in the case of the screw-shaped molding sample shown in FIG. 5A, the heat distribution monitor can monitor the progress state of the mold processing by monitoring the heat distribution. This situation is shown in FIG. 9. A screw-shaped molding sample 500 is set on a mold stage 900, and from above, a heat distribution monitor camera 910 measures a heat distribution on the sample. FIG. 10 shows the monitor result. Heat distribution 1010 on the sample is shown in gradation of color, on a heat distribution monitor output screen 1000.

The failure predicting unit 120 determines whether or not a failure is likely to occur after the processing, based on the monitor result of the processing monitor system 30 (S105). For example, the optical interference monitor monitors the mask-attached pattern sample of FIG. 3A, hence to obtain the time-series graph 800 of the interference light intensity as shown in FIG. 8. In the time-series graph 800 of the interference light intensity, there is shown a fluctuation of the intensity according to the progress of the etching processing. This fluctuation is caused by a change of the optical path difference between the incident light 721 and the reflection light 722, according to a change of the fine structure of the sample with the progress of the etching. However, after a pattern break occurs due to the excessive etching processing and the mask 300 disappears, a change of the fine structure of the sample hardly occurs; as the result, the fluctuation of the interference light almost disappears. In other words, while the fluctuation of the interference light is seen, it is found that a pattern remains and that the normal etching processing proceeds; on the other hand, when no more fluctuation is seen, it is found that the pattern is broken into an incapable state of obtaining any more desired processing result. As shown by the hatched portion in FIG. 8, at the point when the fluctuation change as for the interference light intensity becomes feeble, it is determined that a failure is likely to occur, and the processing proceeds to the procedure S106 as described later.

The heat distribution monitor camera monitors the heat distribution of the screw-shaped molding sample of FIG. 5A, hence to obtain the heat distribution 1010 of FIG. 10. As the mold break often occurs by the melting due to the excessive heat input, a probability of the mold break caused by the melting due to the excessive heat input is previously set by a user at every typical temperature, as shown by a mold break indicator 1020. At the point of approaching a high temperature possible to break the molding, resulting from a rise in the temperature at a specified portion of the sample, it is determined that a failure is likely to occur, and the processing proceeds to the procedure S106. This failure prediction is continuously performed to the processing end.

When the failure occurrence is predicted in the procedure S105, the failure predicting unit 120 issues a failure prevention signal (S106) and the processing apparatus 10 stops the processing (S107). When the processing is stopped, it proceeds to the procedure S102 and onward, where a new processing condition is recommended during the processing stop, and the processing apparatus 10 resumes the processing based on the new processing condition. Here, the processing condition corresponding to the processing stop may be sometimes recommended, and in this case, the processing on this sample is finished.

When no failure occurrence is predicted in the procedure S105, the processing is continued until the end of the processing under the current processing condition, to finish the processing (S108).

Next, the postprocessing measurement system 20 is used to obtain the processing result (S109). It is determined whether or not the processing result satisfies a predetermined success standard set by a user (S110). In other words, it is determined whether or not the obtained processing result satisfies the target processing result. When it satisfies the success standard, the processing condition determination system finishes the processing condition search.

On the other hand, when the processing result does not satisfy the success standard in the procedure S110, this processing result obtained in the procedure S109 and the corresponding processing condition are used to update the processing condition and result DB 130 (S111). Continuously, the processing condition and result correlation model analysis unit 140 uses the processing condition and result DB 130 to update the processing condition and result correlation model (S112). Thereafter, the processing is returned to the procedure S101 and later, to continue the processing condition search.

According to the above-mentioned procedures, the processing condition of giving the target processing result can be searched.

Figure 11:
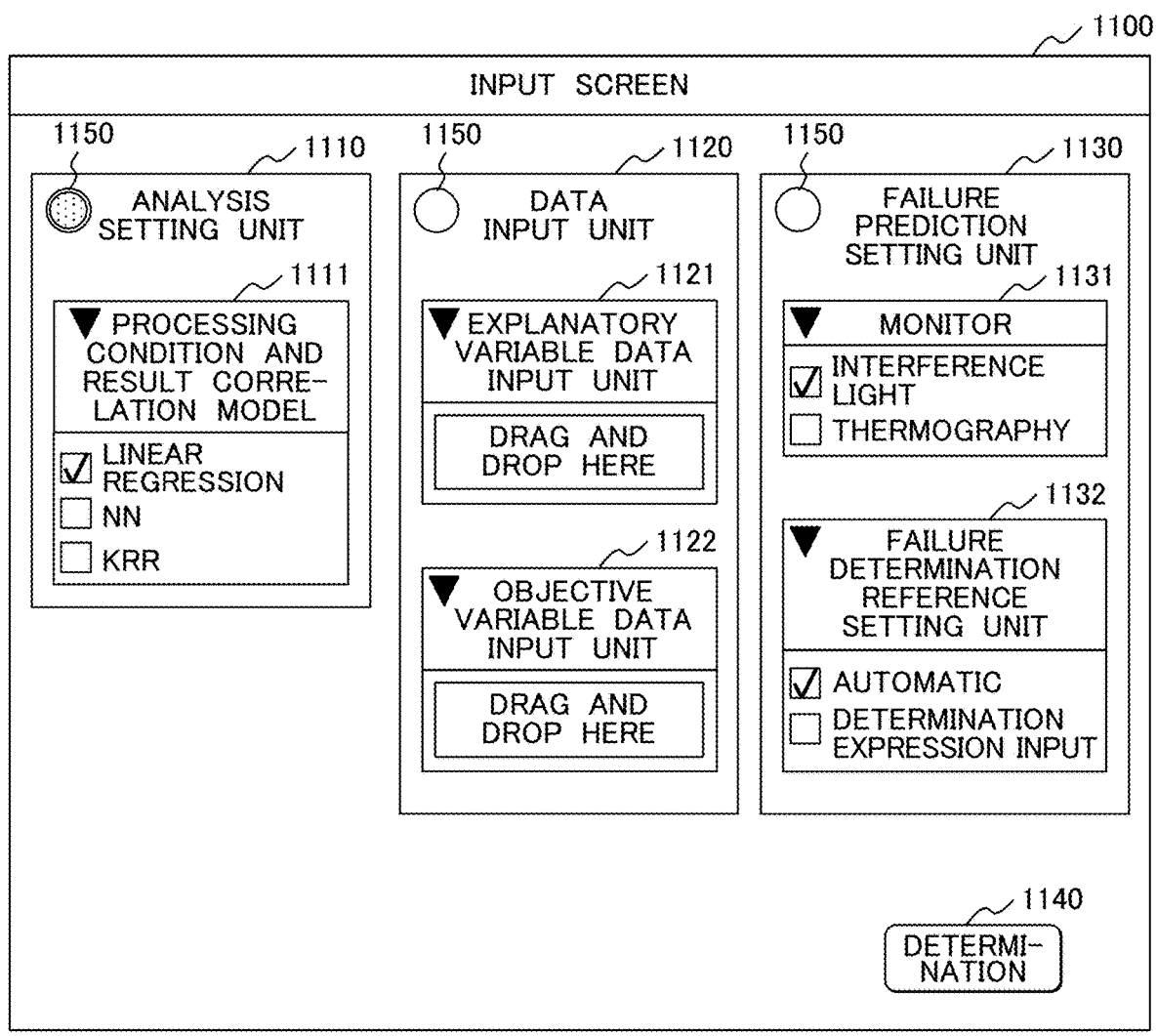
FIG. 11 is a screen example of an input GUI.
Figure 12:
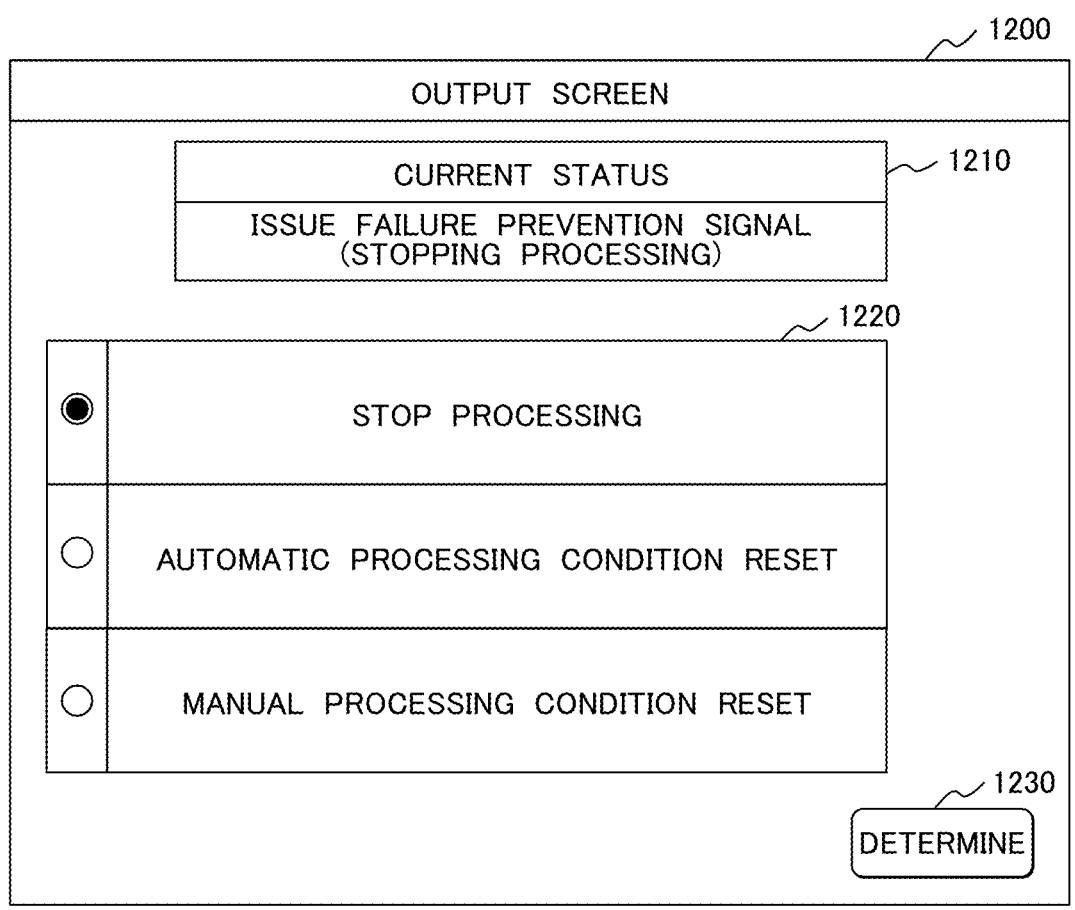
FIG. 12 is a screen example of an output GUI.

The GUI of the analysis system 40 is described using FIGS. 11 to 12.

At first, the GUI as for input is described. The input GUI 1100 is an input screen for entering setting necessary for the processing condition determination system. The input GUI 1100 includes an analysis setting unit 1110, a data input unit 1120, and a failure prediction setting unit 1130, which respectively perform the setting about model estimation in the processing condition and result correlation model analysis unit 140, the upload to the processing condition and result DB 130, and the setting about the failure prediction in the failure predicting unit 120.

The analysis setting unit 1110 includes a processing condition and result correlation model setting input unit 1111. As a model used for estimation, for example, the linear regression, the neutral network (NN), and the Kernel ridge regression (KRR) can be selected in the processing condition and result correlation model setting input unit 1111.

The data input unit 1120 includes an explanatory variable data input unit 1121 and an objective variable data input unit 1122. The data of the explanatory variable and the data of the objective variable are respectively uploaded by using the explanatory variable data input unit 1121 and the objective variable data input unit 1122, hence to update the processing condition and result DB 130. For example, as shown in FIG. 11, by dragging and dropping the data to the input unit, the data can be uploaded.

The failure prediction setting unit 1130 includes a monitor setting unit 1131 and a failure determination reference setting unit 1132. In the monitor setting unit 1131, a desired processing monitor system 30 is selected from the usable in-process monitors mounted in the processing apparatus 10. In the failure determination reference setting unit 1132, a determination reference for the failure predicting unit 120 is input. For example, when the determination expression input is selected, a user is enabled to enter a desired threshold as for the monitor value, and when deviating from the threshold, the failure occurrence can be predicted.

Whether or not the above input is effectively performed is displayed on an effective/non-effective display unit 1150 belonging to each of the setting units. When all the effective/non-effective display units 1150 are effective, a determination button 1140 of the input GUI 1100 is pushed, to prepare for the processing of a new sample (S101), thereby executing the flow as shown in FIG. 2.

FIG. 12 shows an output GUI 1200 which displays the current status of the processing condition determination system and induces a user to select whether the processing is continued or not. A status display unit 1210 has a function of displaying the current status, to display which state in the flow of FIG. 2, for example, during the processing or after the processing. In this example, the status of the processing stop (S107) is displayed.

When the failure prevention signal is issued and it is in the status of stopping the processing, the output GUI 1200 includes a user determination unit 1220 for selecting the processing stop/processing condition reset, and the determination button 1230. When the processing stop is selected in the user determination unit 1220, the processing apparatus 10 stops the processing and the postprocessing measurement system 20 obtains the result. On the other hand, when the automatic processing condition reset is selected, the processing condition analysis unit 150 determines a processing condition again, to resume the processing under the processing condition. Here, the manual processing condition reset is selectable, and in this case, the processing is resumed according to the processing condition determined by a user.

REFERENCE SIGNS LIST

10: processing apparatus
20: postprocessing measurement system
30: processing monitor system
40: analysis system
100: processing condition input unit
110: processing unit
120: failure predicting unit
130: processing condition and result DB
140: processing condition and result correlation model analysis unit
150: processing condition analysis unit
300: mask
301: etched film
310: Top CD
311: dept
500: screw-shaped molding sample
510: average width
511: height
700: wafer
710: mask-attached pattern sample
720: optical element
721: incident light
722: reflection light
800: interference light intensity
900: mold stage
910: heat distribution monitor camera
1000: heat distribution monitor output screen
1010: heat distribution
1020: mold break indicator
1100: input GUI
1110: analysis setting unit
1111: processing condition and result correlation model setting input unit
1120: data input unit
1121: explanatory variable data input unit
1122: objective variable data input unit
1130: failure prediction setting unit
1131: monitor setting unit
1132: failure determination reference setting unit
1140: determination button
1150: effective/non-effective display unit
1200: output GUI
1210: status display unit
1220: user determination unit
1230: determination button

What is claimed is:
1. A processing condition determination system comprising:
a processing apparatus that processes a sample;
a processing monitor system that monitors a state of the processing in the processing apparatus; and
an analysis system that sets a processing condition of the processing apparatus of giving a target processing result,
wherein the analysis system includes:

a processing condition and result database that stores data as a set of an explanatory variable and an objective variable, with one and more parameters of the processing condition under which the processing apparatus processes the sample as the explanatory variable and one and more parameters of the processing result obtained by the processing apparatus' processing the sample under the processing condition as the objective variable;

a processing condition and result correlation model analysis unit that estimates a correlation model of the explanatory variable and the objective variable, using the data stored in the processing condition and result database;

a processing condition analysis unit that sets a processing condition of giving the target processing result, using the correlation model estimated by the processing condition and result correlation model analysis unit; and a failure predicting unit that outputs a failure prevention signal when a probability of failure occurrence as for one and more of the objective variable becomes high after the processing by the processing apparatus, based on the monitor data of the processing monitor system, and the processing apparatus processes the sample under the processing condition set by the processing condition analysis unit and stops the processing under the present processing condition, upon receipt of the failure prevention signal from the failure predicting unit, and the processing condition analysis unit resets a new processing condition of giving the target processing result.

2. The processing condition determination system according to claim 1,
wherein when the processing result obtained by the processing apparatus' processing the sample under the processing condition set by the processing condition analysis unit does not satisfy the target processing result, the processing condition and result database is updated by storing the data that is the set of the explanatory variable corresponding to the processing condition and the objective variable corresponding to the processing result, and
the processing condition and result correlation model analysis unit estimates the correlation model of the explanatory variable and the objective variable, using the updated processing condition and result database.

3. The processing condition determination system according to claim 1, wherein when the failure prevention signal is issued from the failure predicting unit, the analysis system is enabled to select a stop of the processing under the present processing condition or a reset of a processing condition of the processing apparatus.

4. The processing condition determination system according to claim 3, wherein the analysis system is enabled to select a reset of a new processing condition in the processing condition analysis unit and a reset by a user's input of a new processing condition.

5. The processing condition determination system according to claim 1, wherein the processing condition and result correlation model analysis unit estimates a correlation model through machine learning.

6. The processing condition determination system according to claim 1,
wherein the processing apparatus is a semiconductor manufacturing apparatus,
the sample is a semiconductor device, and
the processing monitor system is an optical interference monitor.

7. The processing condition determination system according to claim 1,
wherein the processing apparatus is an additive manufacturing apparatus,
the sample is a molding object, and
the processing monitor system is a heat distribution monitor camera.

8. A processing condition searching method using a processing condition determination system having a processing apparatus that processes a sample, a processing monitor system that monitors a state of the processing in the processing apparatus, and an analysis system that analyzes a processing condition of the processing apparatus of giving a target processing result,
wherein the analysis system includes a processing condition and result database that stores data as a set of an explanatory variable and an objective variable, with one and more parameters of the processing condition under which the processing apparatus processes the sample as the explanatory variable and one and more parameters of the processing result obtained by the processing apparatus' processing the sample under the processing condition as the objective variable;
the analysis system estimates a correlation model of the explanatory variable and the objective variable, using the data stored in the processing condition and result database;
the analysis system sets a processing condition of giving the target processing result, using the estimated correlation model;
the processing apparatus processes the sample under the processing condition set by the analysis system;
the analysis system outputs a failure prevention signal when a probability of failure occurrence as for one and more of the objective variable becomes high after the processing by the processing apparatus, based on the monitor data of the processing monitor system; and
the processing apparatus stops the processing under the present processing condition, upon receipt of the failure prevention signal; and
the analysis system sets a new processing condition of giving the target processing result when the failure prevention signal is output.

9. The processing condition searching method according to claim 8,
wherein when the processing result obtained by the processing apparatus' processing the sample under the processing condition set by the analysis system does not satisfy the target processing result, the processing condition and result database is updated by storing the data that is the set of the explanatory variable corresponding to the processing condition and the objective variable corresponding to the processing result, and
the analysis system estimates the correlation model of the explanatory variable and the objective variable, using the updated processing condition and result database.

10. The processing condition searching method according to claim 8, wherein when the failure prevention signal is issued, the analysis system is enabled to select a stop of the processing under the present processing condition or a reset of a processing condition of the processing apparatus.

11. The processing condition searching method according to claim 10, wherein the analysis system is enabled to select a reset of a new processing condition by the analysis system and a reset by a user's input of a new processing condition.

12. The processing condition searching method according to claim 8, wherein the analysis system estimates the correlation model through machine learning.

13. The processing condition searching method according to claim 8,
   wherein the processing apparatus is a semiconductor manufacturing apparatus,
   the sample is a semiconductor device, and
   the processing monitor system is an optical interference monitor.

14. The processing condition searching method according to claim 8,
   wherein the processing apparatus is an additive manufacturing apparatus,
   the sample is a molding object, and
   the processing monitor system is a heat distribution monitor camera.

* * * * *